United States Patent
Liang (10) Patent No.: US 7,432,441 B2
(45) Date of Patent: Oct. 7, 2008

(54) ASSEMBLY OF MODULARIZED HOUSING AND DOOR COVER

(75) Inventor: Chien-Fa Liang, Chung-Ho (TW)

(73) Assignee: Super Micro Computer, Inc., San Jose, CA (US)

(*) Notice: Subject to any disclaimer, the term of this patent is extended or adjusted under 35 U.S.C. 154(b) by 286 days.

(21) Appl. No.: 11/353,139

(22) Filed: Feb. 14, 2006

(65) Prior Publication Data

US 2007/0187126 A1    Aug. 16, 2007

(51) Int. Cl.
*H02G 3/08* (2006.01)

(52) U.S. Cl. .................. 174/50; 174/17 VA; 361/676; 361/724

(58) Field of Classification Search ............. 174/480, 174/481, 50, 17 R, 17 VA, 53, 57, 58, 66, 174/67, 559; 220/3.2–3.9, 241, 242, 4.02; 361/600, 601, 676, 683, 724, 730, 752; 312/107, 312/108, 308, 310, 321.5, 351.2, 106
See application file for complete search history.

(56) References Cited

U.S. PATENT DOCUMENTS

| | | | |
|---|---|---|---|
| 5,710,402 A | * | 1/1998 | Karnbach et al. ........... 361/676 |
| 5,892,195 A | * | 4/1999 | Aufermann et al. ......... 361/676 |
| 6,193,339 B1 | * | 2/2001 | Behl et al. .................. 361/753 |
| 6,362,951 B1 | * | 3/2002 | Moribe et al. ........... 174/17 VA |
| 6,710,240 B1 | * | 3/2004 | Chen et al. .............. 174/17 VA |
| 6,878,874 B2 | * | 4/2005 | Osborn et al. ................. 174/50 |

* cited by examiner

*Primary Examiner*—Angel R Estrada
(74) *Attorney, Agent, or Firm*—Lowe Hauptman Ham & Berner, LLP (57) ABSTRACT

An assembly of modularized housing and door cover includes a modularized housing; a door cover having a upper part thereof formed with at least one sleeve for putting around the axial pin, and a main body thereof formed with a plurality of ventilation openings; a film having a surface thereof partially adhered to peripheral areas of the ventilation openings using an adhesive layer to form loose-leaf connection; and spring accommodated in the axial pin, and having one end thereof pushed against the wall surface and the other end thereof pushed against an inner wall of the door cover. The modularized housing is provided with excellent ventilation effects therein when assembled with power supply device. The accommodating chambers are not assembled with power supply devices, external air in large amounts is prevented from entering into the idle accommodating chamber, thereby forming negative pressure at the interior of the modularized housing.

9 Claims, 7 Drawing Sheets

ASSEMBLY OF MODULARIZED HOUSING AND DOOR COVER

BACKGROUND OF THE INVENTION (a) Field of the Invention

The invention is related to an assembly of modularized housing and door cover, and more particularly, to an assembly of modularized housing and door cover for industrial computers. Using the assembly, when a accommodating chamber of the modularized housing is inserted by a power supply device, a door cover is capable of flexibly closing in an upward direction; when the accommodating chamber is not inserted by a power supply device, the door cover shuts an opening of the accommodating chamber for isolation.

(b) Description of the Prior Art

When plugging a power supply device to a host housing of a prior industrial computer, a door cover in any forms is unavailable. When the power supply device is drawn when not in use, an accommodating chamber is exposed. External air is entered into the host housing through the accommodating chamber to affect flow directions of air therein.

In addition, when expansion is required for the host housing, merely one accommodating chamber is available for inserting one power supply device, and a new equipment is necessarily purchased for fulfilling such demand.

SUMMARY OF THE INVENTION

The primary object of the invention is to provide an assembly of modularized housing and door cover; wherein, when the modularized housing is assembled with at least one power supply device, an interior thereof is provided with satisfactory ventilation effects; when the accommodating chamber is not assembled to the power supply device, external air in large amounts are prevented from entering into the idle accommodating chamber, thereby forming negative pressure at the interior of the modularized housing.

The other object of the invention is to provide an assembly of a modularized housing and door cover, wherein the modularized housing is devised with a plurality of accommodating chambers for inserting and connecting to at least one power supply device.

To enable a further understanding of the said objectives and the technological methods of the invention herein, the brief description of the drawings below is followed by the detailed description of the preferred embodiments.

DETAILED DESCRIPTION OF THE PREFERRED EMBODIMENTS

Figure 1:
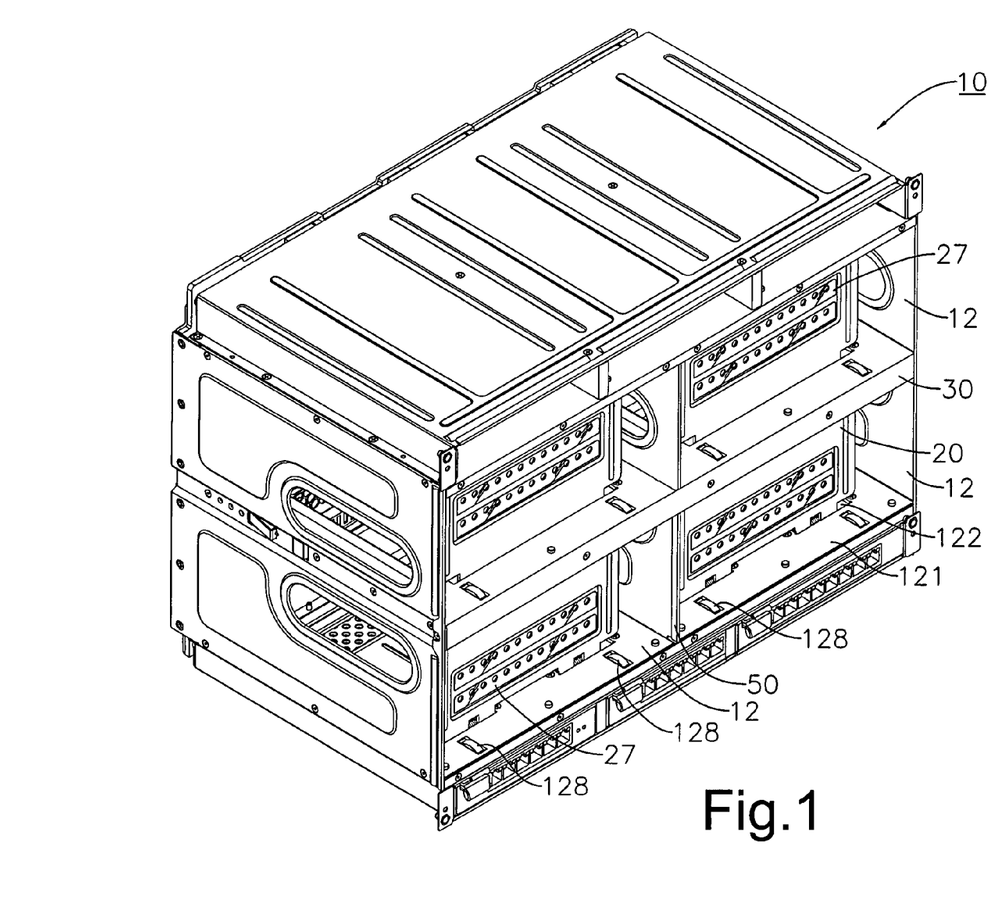
FIG. 1 shows an elevational assembly view according to the invention.
Figure 2:
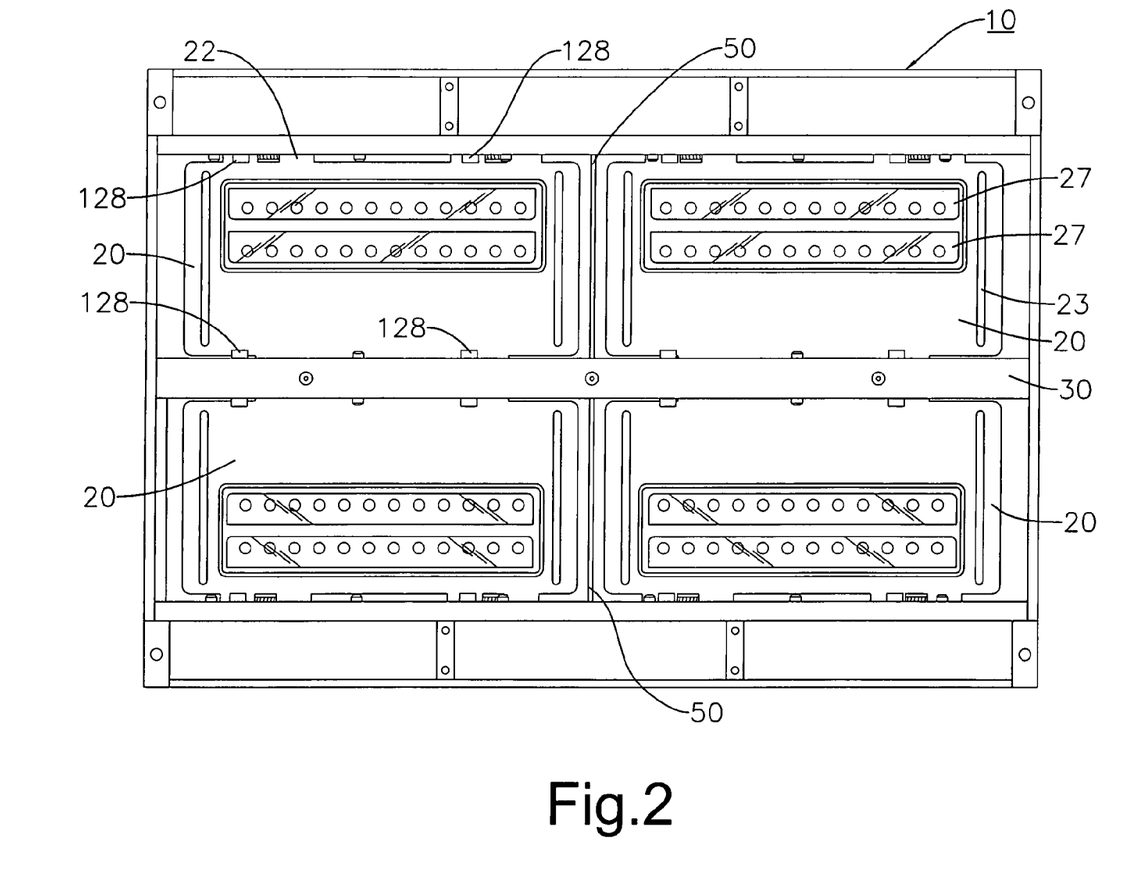
FIG. 2 shows a perspective view according to the invention.
Figure 3:
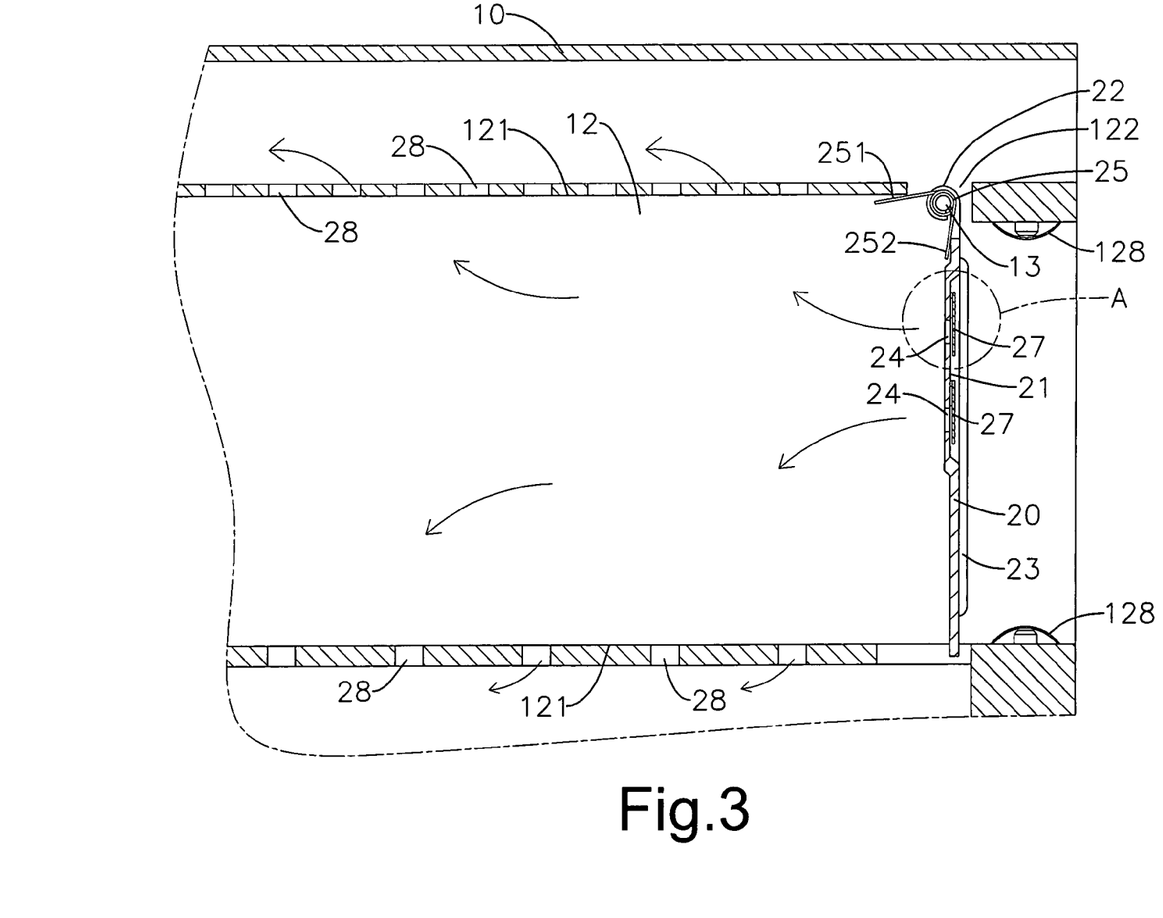
FIG. 3 shows a sectional schematic view illustrating a door cover covering an accommodating chamber according to the invention.
Figure 5:
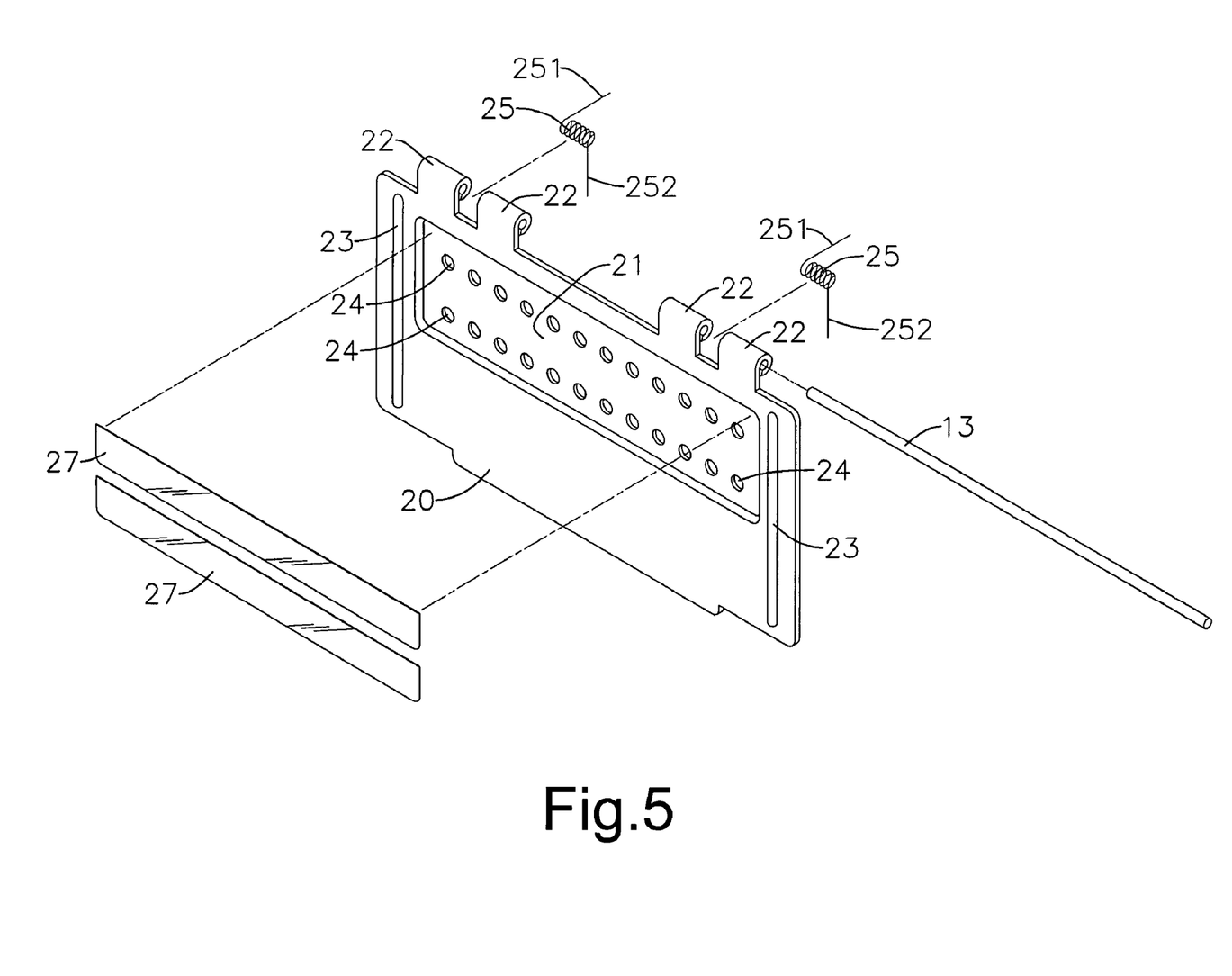
FIG. 5 shows an exploded elevational view of a door cover according to the invention.
Figure 6:
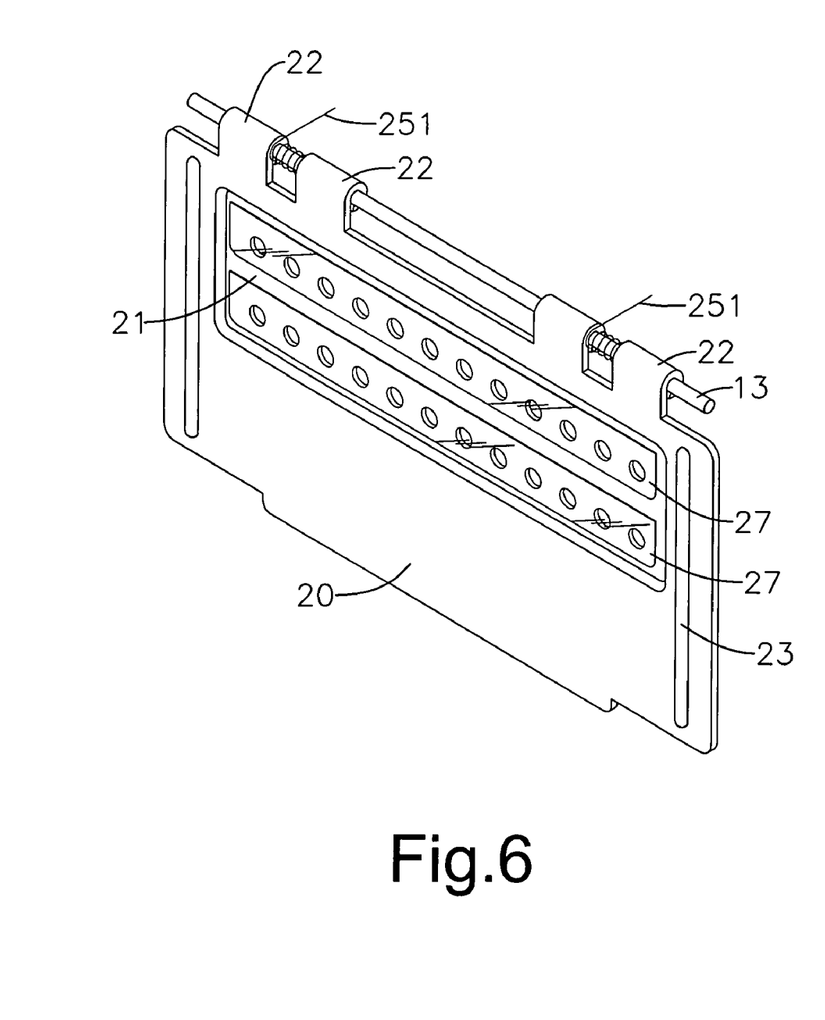
FIG. 6 shows an elevational assembly view of a door cover according to the invention.
Figure 7:
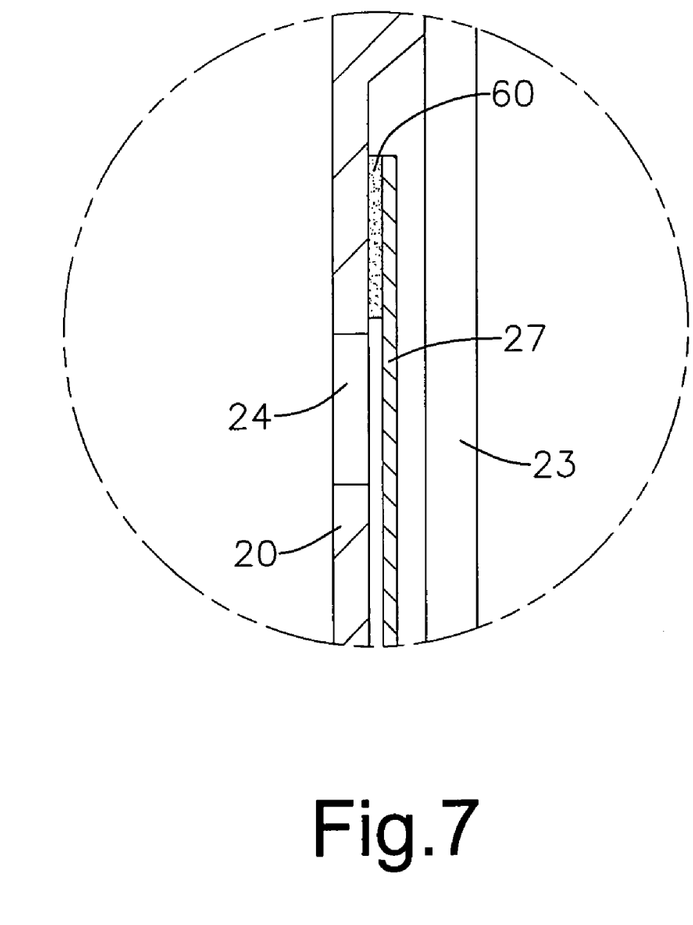
FIG. 7 shows an enlarged view of area A in FIG. 3.

Referring to FIG. 1, FIG. 2 and FIG. 3, an assembly of modularized housing and door cover according to the invention comprises:

a modularized housing 10, which has at least one rectangular accommodating chamber 12 having a wall surface 121 thereof provided with a rectangular hole 122, and an axial pin 13 laterally, pivotally connected and located in the hole 122;

a door cover 20 having a upper part thereof formed with at least one sleeve 22 for putting around the axial pin 13, and a main body thereof formed with a plurality of ventilation openings 24 as shown in FIG. 5 and FIG. 6;

a film 27 having a surface thereof partially adhered to peripheral areas of the ventilation openings 24 using an adhesive layer 60 to form loose-leaf connection as shown in FIG. 7; and at least one spring 25 accommodated in the axial pin 13, and having one end 251 thereof pushed against the wall surface 121 and the other end 252 thereof pushed against an inner wall surface of the door cover 20.

Wherein, the spring 25 and the sleeve 22 are both located in the hole 122 as shown in FIG. 3.

Referring to FIG. 3, wherein the wall surface 121 is provided with a plurality of air-guiding holes 28.

Referring to FIG. 5, wherein any of the accommodating chambers 12 is for inserting and connecting to a power supply device, and the door cover 20 is in an flexibly closed status while approaching the wall surface 121.

Figure 4:
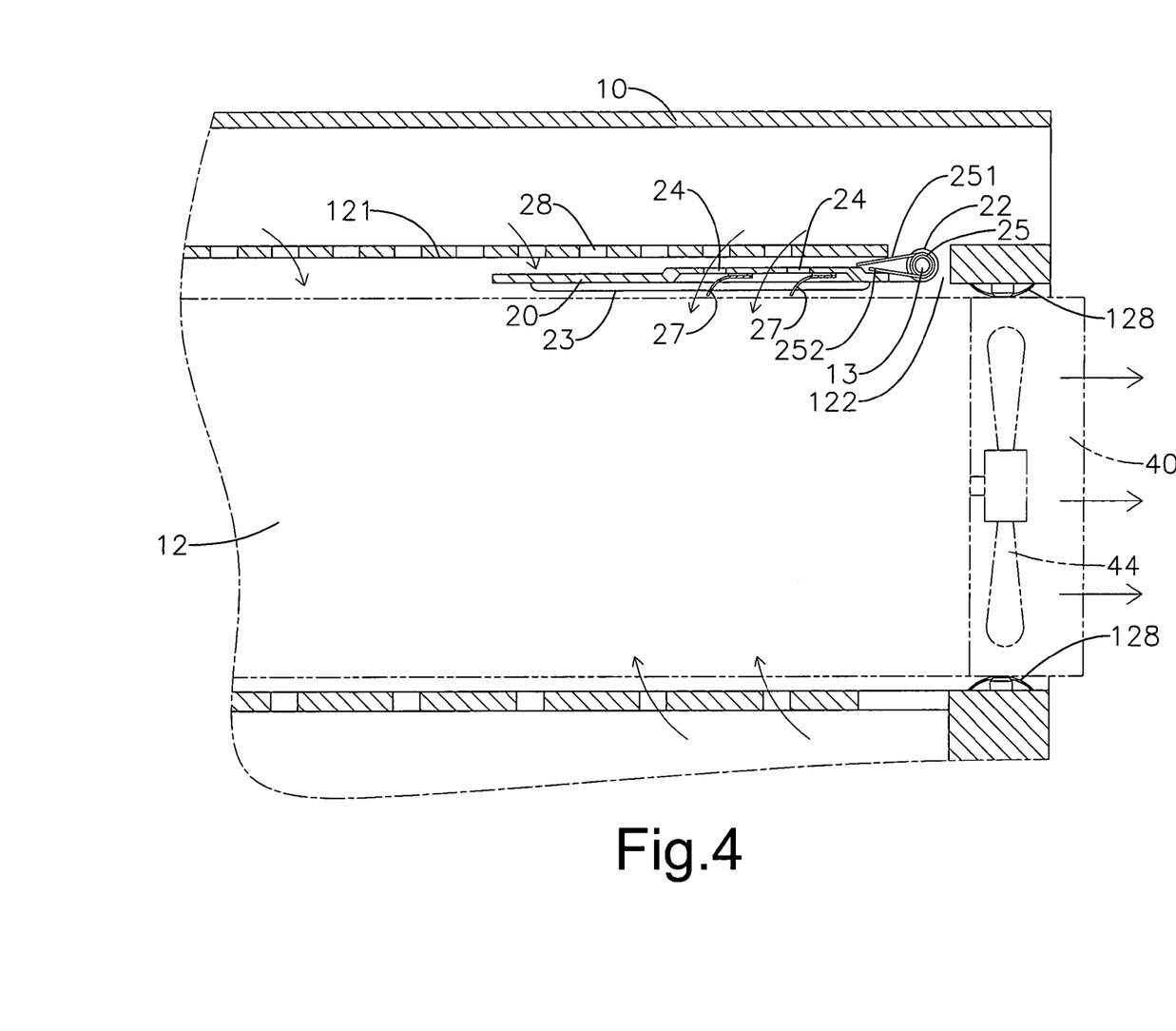
FIG. 4 shows a sectional schematic view a modularized housing according to the invention placed into a power supply device.

Referring to FIG. 1 and FIG. 4, wherein the wall surface 121 situated at an opening of the accommodating chamber 12 is provided with a flexible curved spring plate 128 in a protruding manner.

Referring to FIG. 1 and FIG. 2, wherein the accommodating chambers 12 are provided in quantity of four and have lateral spacing plates 30 and longitudinal spacing plates 50.

Referring to FIG. 5, wherein the door cover 20 is provided with a recessed surface 21, with the ventilation openings 24 formed thereon.

Wherein, the door cover 20 has two side surfaces thereof distributed with longitudinal protruding edges 23.

Wherein, each wall surface 121 of the accommodating chambers 121 is defined as an upper wall surface or a lower wall surface of the accommodating chambers 12.

Wherein, air pressure at the interior of the rectangular accommodating chamber 12 is smaller than air pressure outside the modularized housing 10.

Referring to FIG. 1 and FIG. 2, a modularized housing 10 may be a metal case of an industrial computer, and has at least one accommodating chamber 12. According to the invention, four accommodating chambers 12 are provided. Between adjacent accommodating chambers 12 (12) are lateral spacing plates 30 and longitudinal spacing plates 50. Surface walls 121 of accommodating chambers 12 (12) are provided with air-guiding holes 28 as shown in FIG. 3. At least one power supply device 40 has an interior thereof provided with a fan 44 as shown in FIG. 4. The fan 44 has an air-inducing direction thereof as forwarding air in a specific direction from inside the plurality of accommodating chambers 12 to outside of the accommodating chambers 12, so as to form negative pressure in the accommodating chambers 12. Supposed only one of the four accommodating chambers 12 is equipped with a single power supply device 40 while the other three accommodating chambers 12 are not equipped with main bodies of power supply devices 40 as the accommodating chamber 12 not equipped with the power supply device 40 shown in FIG. 3, for that negative pressure is formed in the idle accommodating chambers 12, circulated air is enabled to flow along a rear side of the accommodating chamber 12 and the air-guiding holes 28 as shown by the arrows in FIG. 3. In case that the door cover 20 is vertically shutting the accommodating chamber 12, air in large amounts is induced from outside the door cover 20 into the accommodating chamber 12 to prevent wind-drawing effects to further affect the negative pressure status inside the accommodating chamber 12. Therefore, due to the negative pressure of the accommodating chamber 12, the film 27 is drawn and vertically attached to peripheral areas of the ventilation openings 24 to shut the ventilation openings 24. Although the accommodating chambers 12 are not inserted by the power supply device 40, openings of the accommodating chambers 12 are still defined as closed by the door cover 20, with the spring 25 being elastically stretched and the door cover 20 being vertically located at the opening, thereby preventing large-amount air outside the accommodating chambers 12 from being absorbed into the accommodating chambers 12.

Referring to FIG. 4, a power supply device 40 has a housing thereof as an air permeable net structure in a square-like shape. When inserted into an accommodating chamber 12, the power supply device 40 is provided with an excellent force-receiving surface using the curved spring plate 128 shown in FIG. 1. For instance, surfaces of the curved spring plate 128 are pressed and flexibly deformed to allow the power supply device 40 to smoothly slide into and position in the accommodating chamber 12. The door cover 20 located at an upper surface of the power supply device 40 and being pushed performs a rotational movement with an angle using the axial pin 13 as a center thereof to appear as a closed status, and the two connecting ends 251 and 252 of the tightened spring 25 are respectively pushed against the wall surface 121 and the inner wall surface of the door cover 20.

When the fan 44 is activated, air inside the accommodating chamber 12 and the power supply device 40 is drawn outward to form negative pressure inside the accommodating chamber 12. Influenced by the negative pressure, the film 27 with loose-leaf connection has unattached parts thereof are peeled off to expose the ventilation openings 24. Through the ventilation openings 24 and the air-guiding holes 28, air in convection inside the accommodating chamber 12 is allowed to flow out of the modularized housing 10 and the power supply device 40, thereby providing heat dissipating effects to cool fixed electronic components or circuits (not shown) in the modularized housing 10 and the power supply device 40. Referring to FIG. 5, FIG. 6, and FIG. 7, the film 27 according to the invention is provided in quantity of two, with partial surfaces thereof adhered to recessed surface 21 on the ventilation openings 24 using an adhesive layer 60 to form loose-leaf connection.

The door cover 20 is devised with a longitudinal protruding section 23, such that the power supply device 40 only comes into contact with the protruding section 23 when being about to insert into the accommodating chamber 12, thereby protecting an entire surface of the door cover 20 from impact and thus preventing deformation.

Referring to FIG. 5 and FIG. 6, the sleeve 22 according to the invention may be provided in quantity of four, and the spring 25 may be provided in quantity of two; and are all put around the axial pin 13. Each spring 25 is located between two adjacent sleeves 22, and all the sleeves 22 and springs 25 are located in the hole 122 as shown in FIG. 3. Thus, the sleeves 22 are allowed with rotational movements of a certain angle in the holes 122.

Referring to FIG. 1 and FIG. 2, the four door covers 20 according to the invention are distinguished into upper and lower levels. The door covers 20 at the upper level are flexibly connected to the wall surface 121 above the accommodating chambers 12 using the sleeves 22, the axial pins 13 and the springs 25. The door covers 20 at the lower level are flexibly connected to the wall surface 121 below the accommodating chambers 12 using the sleeves 22, the axial pins 13 and the springs 25. Air flow in the four accommodating chambers 12 is in circulation. Therefore, when one of the accommodating chambers 12 is inserted with a power supply device 40, wind-drawing effects provided by activation of a single fan 44 as shown in FIG. 4 are sufficient to produce wind-drawing circulation for negative pressure inside the other three accommodating chambers 12. Hence, the films 27 on the door covers 20 of the idle accommodating chambers 12 are drawn to attach on the recessed surface 21 to further shut the ventilation openings 24 as shown in FIG. 3. When the accommodating chamber 12 is inserted by the power supply device 40, the film 27 attached to the door cover 20 horizontally closed in an upper direction or downward direction is partially peeled off due to wind-drawing status from negative pressure, and therefore the ventilation openings 24 are exposed for ventilation purposes as shown in FIG. 4.

It is of course to be understood that the embodiment described herein is merely illustrative of the principles of the invention and that a wide variety of modifications thereto may be effected by persons skilled in the art without departing from the spirit and scope of the invention as set forth in the following claims.

What is claimed is:

1. An assembly of modularized housing and door cover, comprising:
    a modularized housing, which has at least one rectangular accommodating chamber having a wall surface provided with a rectangular hole, and an axial pin laterally, pivotally connected and located in the hole;
    a door cover having an upper part thereof formed with at least one sleeve for putting around the axial pin, and a main body thereof formed with a plurality of ventilation openings;
    a film having a surface thereof partially adhered to peripheral areas of the ventilation openings using an adhesive layer to form loose-leaf connection; and
    at least one spring accommodated in the axial pin, and having one end thereof pushed against the wall surface and the other end thereof pushed against an inner wall surface of the door cover;
    wherein, the spring and the sleeve are located in the hole.

2. The assembly of modularized housing and door cover in accordance with claim 1, wherein the wall surface is provided with a plurality of air-guiding holes.

3. The assembly of modularized housing and door cover in accordance with claim 1, wherein the accommodating chamber may be inserted by a power supply device, and the door cover is in a flexibly closed status while approaching the wall surface.

4. The assembly of modularized housing and door cover in accordance with claim 1, wherein the wall surface situated at an opening of the accommodating chamber is provided with a flexible curved spring plate in a protruding manner.

5. The assembly of modularized housing and door cover in accordance with claim 1, wherein the accommodating chambers are provided in quantity of four and have lateral spacing plates and longitudinal spacing plates.

6. The assembly of modularized housing and door cover in accordance with claim 1, wherein the door cover is provided with a recessed surface, with the ventilation openings formed thereon.

7. The assembly of modularized housing and door cover in accordance with claim 1, wherein the door cover has two side surfaces thereof distributed with longitudinal protruding edges.

8. The assembly of modularized housing and door cover in accordance with claim 1, the wall surface of the accommodating chamber is defined as an upper wall surface or a lower wall surface of the accommodating chamber.

9. The assembly of modularized housing and door cover in accordance with claim 1, wherein, air pressure at the interior of the rectangular accommodating chamber is smaller than air pressure outside the modularized housing.

* * * * *